(12) United States Patent
Miller et al.

(10) Patent No.: US 7,009,745 B2
(45) Date of Patent: Mar. 7, 2006

(54) COATING FOR OPTICAL MEMS DEVICES

(75) Inventors: Seth A. Miller, Sachse, TX (US);
Simon Joshua Jacobs, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 61 days.

(21) Appl. No.: 10/699,410

(22) Filed: Oct. 31, 2003

(65) Prior Publication Data

US 2004/0136044 A1    Jul. 15, 2004

Related U.S. Application Data

(60) Provisional application No. 60/423,143, filed on Oct. 31, 2002.

(51) Int. Cl.
*G02B 26/08* (2006.01)

(52) U.S. Cl. ............... 359/212; 359/223; 359/224; 359/584; 359/900

(58) Field of Classification Search ........ 359/196–227, 359/230, 290, 298, 838, 846–848, 850, 855–857, 359/871–872, 896, 900, 580, 582, 584
See application file for complete search history.

(56) References Cited

U.S. PATENT DOCUMENTS

| | | | |
|---|---|---|---|
| 5,061,049 A | | 10/1991 | Hornbeck |
| 5,096,279 A | | 3/1992 | Hornbeck et al. |
| 5,172,262 A | * | 12/1992 | Hornbeck ............... 359/223 |
| 5,583,688 A | | 12/1996 | Hornbeck |
| 6,147,790 A | * | 11/2000 | Meier et al. ............ 359/291 |
| 6,282,010 B1 | | 8/2001 | Sulzbach et al. |
| 6,549,694 B1 | * | 4/2003 | Makino et al. ........... 385/18 |

* cited by examiner

*Primary Examiner*—James Phan
(74) *Attorney, Agent, or Firm*—Charles A. Brill; Wade James Brady, III; Frederick J. Telecky, Jr.

(57) ABSTRACT

A micromechanical device having a deflectable member which contacts a stationary member. An antireflective coating is applied to portions of the micromechanical device to limit undesired reflection from the device. A passivation or lubrication layer is applied to the device to reduce stiction between the deflectable member and the stationary member. An insulator layer is utilized between the antireflective coating and the lubrication layer to prevent photoelectric-induced breakdown of the lubrication layer.

39 Claims, 3 Drawing Sheets

COATING FOR OPTICAL MEMS DEVICES

This application claims priority under 35 USC § 119(e)(1) of provisional application No. 60/423,143 filed Oct. 31, 2002.

CROSS-REFERENCE TO RELATED APPLICATIONS

The following patents and/or commonly assigned patent applications are hereby incorporated herein by reference:

| Patent No. | Filing Date | Issue Date | Title |
|---|---|---|---|
| 5,061,049 | Sep. 13, 1990 | Oct. 29, 1991 | Spatial Light Modulator and Method |
| 5,096,279 | Nov. 26, 1990 | Mar. 17, 1992 | Spatial Light Modulator and Method |
| 5,583,688 | Dec. 21, 1993 | Dec. 10, 1996 | Multi-Level Digital Micromirror Device |
| 6,282,010 B1 | May 6, 1999 | Aug. 29, 2001 | Anti-Reflective Coatings for Spatial Light Modulators |

FIELD OF THE INVENTION

This invention relates to the field of micro electromechanical systems, particularly to micro optical electromechanical systems (MOEMS), more particularly to coatings for MOEMS that are particularly useful in the presence of lubricants used in these MEMS.

BACKGROUND OF THE INVENTION

Micro-mechanical devices are small structures typically fabricated on a semiconductor wafer using techniques such as optical lithography, doping, metal sputtering, oxide deposition, and plasma etching which have been developed for the fabrication of integrated circuits. Micro electromechanical systems (MEMS) have both electrical circuitry and mechanical systems integrated in a single device. Micro optical-electromechanical systems (MOEMS) are a subset of MEMS that have optical components integrated with the electromechanical systems.

Micromechanical devices include micromirror devices, accelerometers, pressure and flow sensors, gears and motors. While some micro-mechanical devices, such as pressure sensors, flow sensors, and micromirrors have found commercial success, other types have not yet been commercially viable.

Micromirror devices are primarily used in optical display systems. In display systems, the micromirror is a spatial light modulator that uses digital image data to modulate a beam of light by selectively reflecting portions of the beam of light to a display screen. While analog modes of operation are possible, micromirrors typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics were used to illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the micromirror surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

The deflectable portion of the micromirror device is prone to sticking to the landing portion of the underlying metal layer. There are several mechanisms that create this stiction force, including cold welding and van der Waals force. To lessen the likelihood of sticking, a lubrication layer, sometimes referred to a passivation layer, is used. Micromirrors typically use a perfluorodecanoic acid (PFDA) monolayer to prevent the deflectable members from permanently sticking to the landing zones.

While much has been done to improve the mechanical performance and reliability of micromirror devices, there still is a need for methods and systems of improving the reliability of the device and the contrast of the images produced by the devices.

SUMMARY OF THE INVENTION

Objects and advantages will be obvious, and will in part appear hereinafter and will be accomplished by the present invention, which provides a coating for a micromechanical device and method thereof. One embodiment of the claimed invention provides a method of forming a coating comprising: providing a substrate having a metal layer; applying an antireflective layer to the substrate layer; applying an insulator layer to the antireflective layer; and applying a lubrication layer to the insulator layer. According to another embodiment of the present invention, a micromechanical device is provided. The micromechanical device comprising: a substrate; a reflective member supported on the substrate; an antireflective coating supported on the reflective member; an insulator layer supported on the antireflective coating; and a lubrication layer supported on the insulator layer. According to yet another embodiment of the present invention, an optical system is provided. The optical system comprising: a light source for providing a beam of light along a light path; and a device on the light path, the device comprising: a substrate; a reflective layer; an antireflective coating supported on the reflective layer; an insulation layer supported on the antireflective coating; and a lubrication layer on the insulation layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
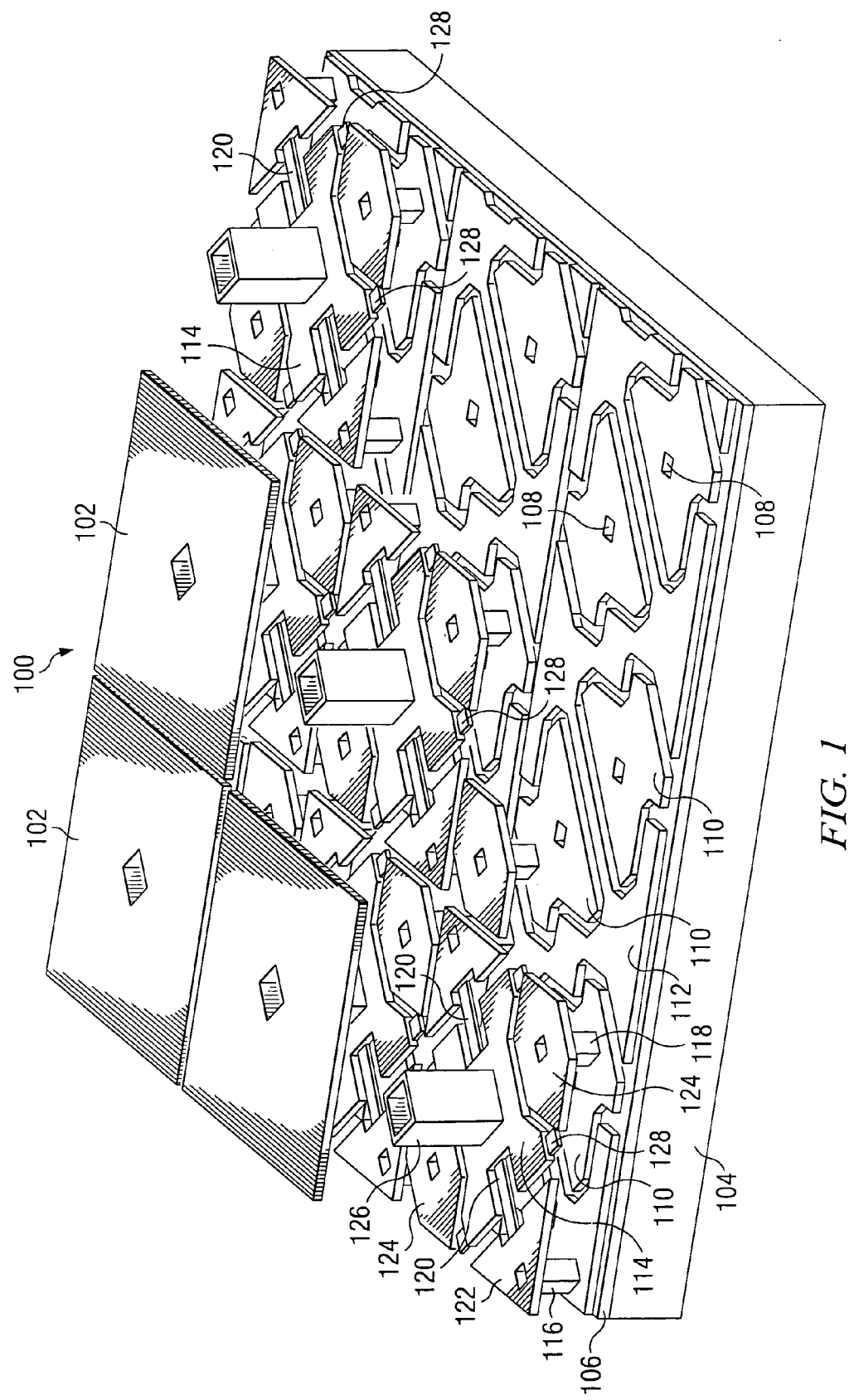
FIG. 1 is a perspective view of a small portion of a micromirror array.

A method has been developed to enable antireflective coatings to be used with micromirror devices without degradation of the anti-stiction coatings. One embodiment of the present invention provides a method of fabricating a micromirror device that comprises the antireflective coating. Another embodiment of the present invention provides a micromirror having a highly reliable antireflective coating that does not degrade the anti-stiction coatings. Yet another embodiment of the present invention provides optical systems including a micromirror having a highly reliable antireflective coating that does not degrade the anti-stiction coatings.

Antireflective Coatings

High image contrast—the ratio of the brightness of bright image areas to dim image areas—is necessary to enable the generation of visually pleasing images. Traditional cathode ray tubes (CRTs) can have image contrast measurements of up to 2000:1. Micromirror display systems originally were limited to contrast ratios of around 500:1. Light scattered by the various components of the display led to the comparatively low contrast achieved by the original micromirror display systems.

Many innovations have lead to micromirror systems having contrast ratios approaching that of the CRT. Some of the innovations have been in the area of illumination and projection optics. Other innovations have reduced the light scattered by the micromirror. Changes to the micromirror architecture, including lowering the height of the micromirrors above the substrate metalization and a reduction in the spacing between the mirror elements, have reduced the amount of light that passes through mirrors and the ability of the underlying metalization to scatter the light that does pass through the mirrors. Another innovation is the use of a dark coating applied to the metal layers beneath the micromirrors.

The coating typically used is titanium nitride, which is sputtered onto the aluminum alloy after the aluminum alloy layer is patterned to form address and landing electrodes. The reflectivity of titanium nitride is only about 30% of that of aluminum over the visible spectrum and thus greatly reduces the amount of light scattered by the structures under the mirrors. The reduction in the amount of light scattered by the structures under the mirrors in turn improves the contrast ratio of the micromirror device by more than 100%.

Degradation of the Lubrication System

Unfortunately, the titanium nitride layer deposited on the underlying metal layer has an adverse effect on the long term stability of the lubrication layer. The titanium nitride layer absorbs photons which create electron-hole pairs. When the photon strikes a titanium nitride covered landing electrode, which is typically biased at a negative voltage, the hole migrates to the underlying landing electrode and is carried to the voltage bias supply. The electron migrates to the surface of the titanium nitride coating.

At the surface of the titanium nitride covering the landing electrode, the electron is transferred to the lubrication system. The electron causes a breakdown in the PFDA monolayer. Over time, this compromises the ability of the PFDA layer to prevent stiction and the device eventually fails.

Protection of the Lubrication Monolayer

The titanium nitride layer, or any other layer of material that absorbs photons and generates electron-hole pairs that can migrate to the surface of the layer, must be electrically isolated from the passivation or lubrication layer in order to protect the lubrication layer from the charge migrating to the surface of the titanium nitride layer.

One method of protecting the lubrication layer involves insulating the titanium nitride layer. One embodiment of the present invention provides an isolation layer between the layer that absorbs photons and releases electrons on the one side, and the lubrication layer on the other side. The isolation layer typically is oxide that is deposited or grown over the surface of the electron producing layer.

One method of producing the oxide layer that is particularly well suited to the production of micromirror devices is to deposit a very thin layer of aluminum over the titanium nitride layer. The aluminum layer is thin enough to not adversely effect the antireflective properties of the titanium nitride layer, and adheres well to the titanium nitride. According to one embodiment, the aluminum layer is less than 100 angstroms thick. When exposed to air, the aluminum layer quickly oxides to form aluminum oxide. The aluminum oxide layer insulates the titanium nitride layer and prevents the migration of photon-generated electrodes from the titanium nitride layer into the oxide layer. Alternate metal layers may be used provided they oxidize to form the protective layer and are compatible with the fabrication process. The thickness of the metal layer is sufficient to form the insulating oxide layer yet thin enough to avoid impairing the function of the antireflective coating. For example, a 200 angstrom aluminum layer forms a sufficient oxide layer, but may defeat the purpose of the antireflective coatings by reflecting too much light.

Another method of producing the oxide layer that is particularly well suited to the production of micromirror devices is to form a silicon dioxide layer over the titanium nitride layer. The silicon dioxide layer typically is formed by plasma deposition. During the manufacture of micromirror devices it can be important to form the insulative oxide layer at low temperatures.

Description of an Improved Micromirror Device

Figure 2:
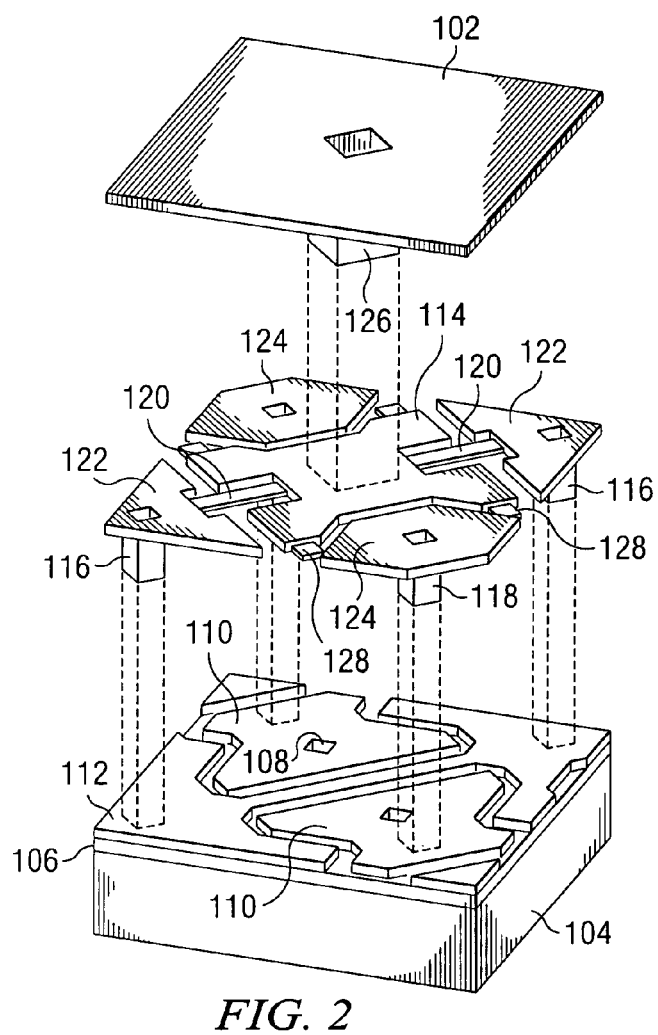
FIG. 2 is an exploded perspective view of a single micromirror element from the micromirror array of FIG. 1.
Figure 4:
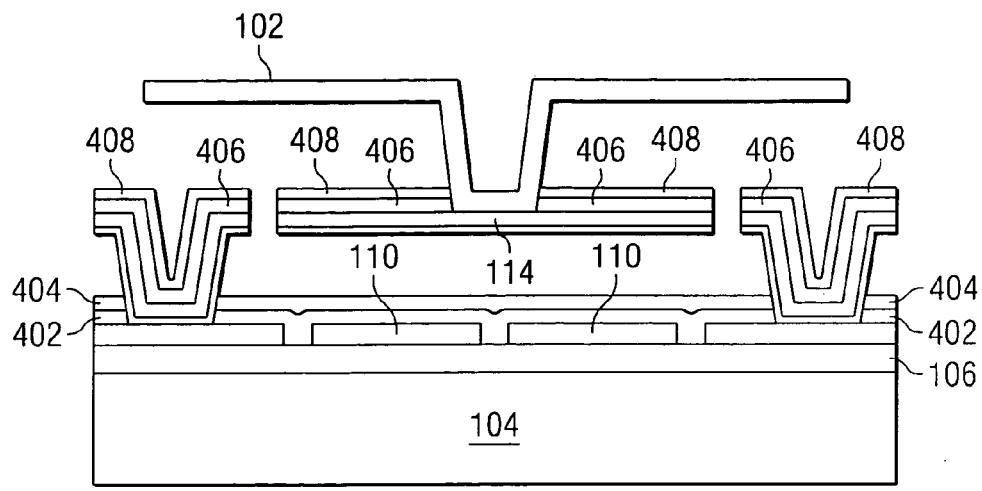
FIG. 4 is a cross section side view of a portion of the micromirror array of FIG. 1 showing a insulator layer applied to portions of the micromirror array.

A hidden-hinge micromirror 100 is an orthogonal array of micromirror cells, or elements. This array often includes more than a thousand rows and columns of micromirrors. FIG. 1 shows a small portion of a micromirror array with several mirrors 102 removed to show the underlying mechanical structure of the micromirror array. FIG. 2 is an exploded view of a single micromirror element further detailing the relationships between the micromirror structures. In order to show the underlying structures, the antireflective coatings and insulating layers are not shown in FIGS. 1 and 2. FIG. 4 shows the antireflective coatings and insulating layers.

A micromirror is fabricated on a semiconductor substrate 104, typically a silicon substrate. Electrical control circuitry is typically fabricated in or on the surface of the semiconductor substrate 104 using standard integrated circuit process flows. This circuitry typically includes, but is not limited to, a memory cell associated with, and typically underlying, each mirror 102 and digital logic circuits to control the transfer of the digital image data to the underlying memory cells. Voltage driver circuits to drive bias and reset signal to the mirror superstructure may also be fabricated on the micromirror substrate, or may be external to the micromirror. Image processing and formatting logic is also formed in the substrate 104 of some designs. For the purposes of this disclosure, addressing circuitry is considered to include any circuitry, including direct voltage connections and shared memory cells, used to control the direction of rotation of a micromirror.

The silicon substrate 104 and any necessary metal interconnection layers are isolated from the micromirror superstructure by an insulating layer 106 which is typically a deposited silicon dioxide layer on which the micromirror superstructure is formed. Holes, or vias, are opened in the oxide layer to allow electrical connection of the micromirror superstructure with the electronic circuitry formed in the substrate 104.

Address electrodes 110 and a mirror bias connection 112 are formed from a metal layer deposited on the insulating layer 106. Some micromirror designs have separate and distinct landing electrodes that are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the micromirror. Since the same voltage is always applied both to the landing electrodes and the mirrors 102, the mirror bias connection and the landing electrodes are combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are often coated with a material chosen to reduce the tendency of the mirror 102 and torsion hinge yoke 114 to stick to the landing site.

Hinge support spacervias 116 and upper address electrode spacervias 118, typically extend approximately 1 $\mu$m above the address electrodes 110 and mirror bias connections 112. A hinge cap 122 and upper address electrodes 124 are supported by the hinge support spacervias 116 and upper address electrode spacervias 118. The hinge cap 122 anchors the ends of torsion hinges 120. A hinge yoke 114 is formed between and supported by the torsion hinges 120. The hinge yoke 114 is allowed to rotate by twisting the thin torsion hinges 120. A mirror support spacervia 126 is formed on the hinge yoke, and supports a mirror 102 approximately 2 $\mu$m above the hinge yoke 114.

Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

The force created by the voltage potential is a function of the reciprocal of the distance between the two plates. As the rigid member rotates due to the electrostatic torque, the torsion beam hinges resist deformation with a restoring torque that is an approximately linear function of the angular deflection of the torsion beams. The structure rotates until the restoring torsion beam torque equals the electrostatic torque or until the rotation is mechanically blocked by contact between the rotating structure and a fixed component. Most micromirror devices are operated in a digital mode wherein sufficiently large bias voltages are used to ensure full deflection of the micromirror superstructure.

When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

Fabrication of a Micromirror Device

Figure 3:
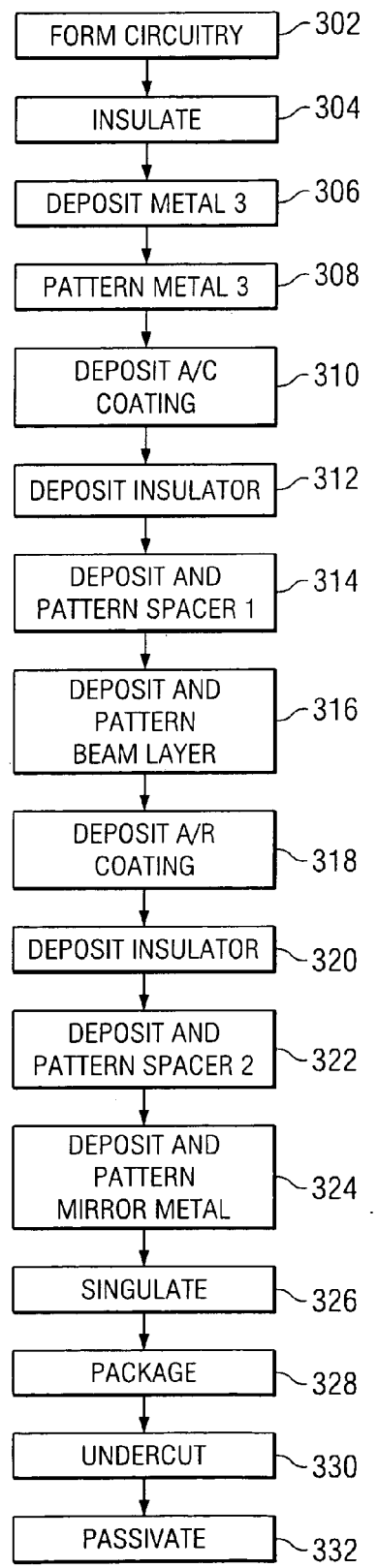
FIG. 3 is a flow diagram describing the process of fabricating the micromirror array of FIG. 1.

FIG. 3 is a flow diagram showing the various process steps used to fabricate the micromirror array having both an antireflective coating and a protective layer isolating the antireflective coating from the lubrication system layer as shown in FIGS. 1, 2 and 4. The reference numbers used below to describe the process steps refer to the flow diagram of FIG. 3, while the reference numbers used to describe portions of the micromirror structure refer to FIGS. 1, 2, and 4. FIG. 4 is a cross section of a portion of the micromirror array of FIG. 1 showing the location of an insulating layer formed on the antireflective layer.

A micromirror is fabricated on a semiconductor substrate 104, typically a silicon substrate. Electrical control circuitry is typically fabricated in or on the surface of the semiconductor substrate 104 using standard integrated circuit process flows as shown by block 302. This circuitry typically includes, but is not limited to, a memory cell associated with, and typically underlying, each mirror 102 and digital logic circuits to control the transfer of the digital image data to the underlying memory cells. Voltage driver circuits to drive bias and reset signals to the mirror superstructure may also be fabricated on the micromirror substrate, or may be external to the micromirror. Image processing and formatting logic is also formed in the substrate 104 of some designs. For the purposes of this disclosure, addressing circuitry is considered to include any circuitry, including direct voltage connections and shared memory cells, used to control the direction of rotation of a micromirror.

Some micromirror configurations use a split reset configuration which allows several micromirror elements to share one memory cell—thus reducing the number of memory cells necessary to operate a very large array, and making more room available for voltage driver and image processing circuitry on the micromirror integrated circuit. Split reset is enabled by the bistable operation of a micromirror, which allows the contents of the underlying memory to change without affecting the position of the mirror 102 when the mirror has a bias voltage applied.

The silicon substrate 104 and any necessary metal interconnection layers are isolated from the micromirror superstructure by an insulating layer 106 which is typically a deposited silicon dioxide layer on which the micromirror superstructure is formed. Block 304 of FIG. 3 represents the provision of an insulating layer. Holes, or vias, are opened in the oxide layer to allow electrical connection of the micromirror superstructure with the electronic circuitry formed in the substrate 104.

The first layer of the superstructure is a metalization layer, typically the third metalization layer and therefore often called metal three or M3. The first two metalization layers are typically required to interconnect the circuitry fabricated on the substrate. The third metalization layer is deposited on the insulating layer, as shown by block 306 of FIG. 3, and patterned to form address electrodes 110 and a mirror bias connection 112, as shown by block 308 of FIG. 3. Some micromirror designs have landing electrodes that are separate and distinct structures but are electrically connected to the mirror bias connection 112. Landing electrodes limit the rotation of the mirror 102 and prevent the rotated mirror 102 or hinge yoke 114 from touching the address electrodes 110, which have a voltage potential relative to the mirror 102. If the mirror 102 contacts the address electrodes 110, the resulting short circuit could fuse the torsion hinges 120 or weld the mirror 102 to the address electrodes 110, in either case ruining the micromirror.

Since the same voltage is always applied both to the landing electrodes and the mirrors 102, the mirror bias connection and the landing electrodes are preferably combined in a single structure when possible. The landing electrodes are combined with the mirror bias connection 112 by including regions on the mirror bias/reset connection 112, called landing sites, which mechanically limit the rotation of the mirror 102 by contacting either the mirror 102 or the torsion hinge yoke 114. These landing sites are coated with a material chosen to reduce the tendency of the mirror 102 and torsion hinge yoke 114 to stick to the landing site during a later process step.

Mirror bias/reset voltages travel to each mirror 102 through a combination of paths using both the mirror bias/reset metalization 112 and the mirrors and torsion beams of adjacent mirror elements. Split reset designs require the array of mirrors to be subdivided into multiple subarrays each having an independent mirror bias connection. The landing electrode/mirror bias 112 configuration shown in FIG. 1 is ideally suited to split reset applications since the micromirror elements are easily segregated into electrically isolated rows or columns simply by isolating the mirror bias/reset layer between the subarrays. The mirror bias/reset layer of FIG. 1 is shown divided into rows of isolated elements.

An antireflective coating 402 is applied to the metal three layer as indicated by block 310 of FIG. 3. Antireflective coatings are further described in U.S. Pat. No. 6,282,010 B1. An insulator layer 404 according to the present invention is deposited over the antireflective coating by step 312.

A first layer of supports, typically called spacervias, is fabricated on the metal layer forming the address electrodes 110 and mirror bias connections 112. These spacervias, which include both hinge support spacervias 116 and upper address electrode spacervias 118, are typically formed by spinning a thin spacer layer over the address electrodes 110 and mirror bias connections 112. This thin spacer layer is typically a 1 $\mu$m thick layer of positive photoresist. After the photoresist layer is deposited, it is exposed, patterned, and deep UV hardened to form holes in which the spacervias will be formed. This spacer layer and a thicker spacer layer used later in the fabrication process are often called sacrificial layers since they are used only as forms during the fabrication process and are removed from the device prior to device operation.

A thin layer of metal is sputtered onto the spacer layer and into the holes. An oxide is then deposited over the thin metal layer and patterned to form an etch mask over the regions that later will form hinges 120. A thicker layer of metal, typically an aluminum alloy, is sputtered over the thin layer and oxide etch masks. Another layer of oxide is deposited and patterned to define the hinge yoke 114, hinge cap 122, and the upper address electrodes 124. After this second oxide layer is patterned, the two metals layers are etched simultaneously and the oxide etch stops removed to leave thick rigid hinge yokes 114, hinge caps 122, and upper address electrodes 124, and thin flexible torsion beams 120. The hinge yoke 114 is often referred to as a beam. For the purposes of this disclosure, references to the beam layer will refer to both the thin hinge metal layer and the thicker hinge yoke metal layer, or as described below, a single metal layer forming both the hinge and the hinge yoke.

An alternative to the buried hinge process described above is the use of a single metal layer to form the beam, torsion hinges, and hinge support spacervias. The use of a single layer eliminates many processing steps, but because the thickness of the single layer determines not only the rigidity of the beam layer but the compliance of the torsion hinge, it can be more difficult to design a single beam layer device.

A second antireflective layer 406 is deposited on the beam layer in block 318 of FIG. 3 and covered by a second insulator layer 408 in block 320. A thick spacer layer is then deposited over the thick metal layer and the antireflective and insulator layers, and patterned to define holes in which mirror support spacervias 126 will be formed as indicated in block 322. The thick spacer layer is typically a 2 $\mu$m thick layer of positive photoresist. A layer of mirror metal, typically an aluminum alloy, is sputtered on the surface of the thick spacer layer and into the holes in the thick spacer layer. This metal layer is then patterned to form the mirrors 102 as shown in block 324 of FIG. 3.

Block 326 shows the semiconductor wafer on which a number of DMDs are formed being separated into individual micromirror arrays. After singulation, the die are attached to a package substrate in block 328 and both spacer layers are removed using a plasma etch as shown in block 330. The device is then passivated in block 332 by the application of the lubrication layer.

Once the two spacer layers have been removed, the mirror is free to rotate about the axis formed by the torsion hinge. Electrostatic attraction between an address electrode 110 and a deflectable rigid member, which in effect form the two plates of an air gap capacitor, is used to rotate the mirror structure. Depending on the design of the micromirror device, the deflectable rigid member is the torsion beam yoke 114, the beam or mirror 102, a beam attached directly to the torsion hinges, or a combination thereof. The upper address electrodes 124 also electrostatically attract the deflectable rigid member.

Operation of the Micromirror Device

The force created by the voltage potential is a function of the reciprocal of the distance between the two plates. As the rigid member rotates due to the electrostatic torque, the torsion beam hinges resist deformation with a restoring torque that is an approximately linear function of the angular deflection of the torsion beams. The structure rotates until the restoring torsion beam torque equals the electrostatic torque or until the rotation is mechanically blocked by contact between the rotating structure and a fixed component. As discussed below, most micromirror devices are operated in a digital mode wherein sufficiently large bias voltages are used to ensure full deflection of the micromirror superstructure.

Micromirror devices are generally operated in one of two modes of operation. The first mode of operation is an analog mode, sometimes called beam steering, wherein the address electrode is charged to a voltage corresponding to the desired deflection of the mirror. Light striking the micromirror device is reflected by the mirror at an angle determined by the deflection of the mirror. Depending on the voltage applied to the address electrode, the cone of light reflected by an individual mirror is directed to fall outside the aperture of a projection lens, partially within the aperture, or completely within the aperture of the lens. The reflected light is focused by the lens onto an image plane, with each individual mirror corresponding to a fixed location on the image plane. As the cone of reflected light is moved from completely within the aperture to completely outside the aperture, the image location corresponding to the mirror dims, creating continuous brightness levels.

The second mode of operation is a digital mode. When operated digitally, each micromirror is fully deflected in either of the two directions about the torsion beam axis. Digital operation uses a relatively large voltage to ensure the mirror is fully deflected. Since it is advantageous to drive the address electrode using standard logic voltage levels, a bias voltage, typically a negative bias voltage, is applied to the mirror metal layer to increase the voltage difference between the address electrodes and the mirrors. Use of a sufficiently large mirror bias voltage—a voltage above what is termed the collapse voltage of the device—ensures the mirror will deflect to the closest landing electrodes even in the absence of an address voltage. Therefore, by using a large mirror bias voltage, the address voltages need only be large enough to deflect the mirror slightly.

To create an image using the micromirror device, the light source is positioned at an angle equal to twice the angle of rotation so that mirrors rotated toward the light source reflect light in a direction normal to the surface of the micromirror device and into the aperture of a projection lens—creating a bright pixel on the image plane. Mirrors rotated away from the light source reflect light away from the projection lens—leaving the corresponding pixel dark. Intermediate brightness levels are created by pulse width modulation techniques in which the mirror is rapidly and repetitively rotated on and off. The duty cycle of the mirror determines the quantity of light reaching the image plane. The human eye integrates the light pulses and the brain perceives a flicker-free intermediate brightness level.

Full-color images are generated by using three micromirror devices to produce three single-color images, or by sequentially forming three single-color images using a single micromirror device illuminated by a beam of light passing through three color filters mounted on a rotating color wheel.

Depending on the physical design of the device, an antireflective layer may be used on either the metal three or beam levels, or both. The thickness of the spacer 1 layer partially determines how much light is able to reach the metal three layer, while the thickness of a spacer layer deposited on the beam layer partially determines the amount of light that will be able to reach the underlying metal beam layer. It may be sufficient to apply the antireflective layers to only one of the metal three and beam layers.

Typical micromirrors only land on either the metal three layer, or, in some designs, on metal in the beam layer. Landing on the beam layer uses either spring tips descending from the bottom surface of the mirror, or raised landing electrodes supported by vias above the substrate.

Although the insulator layer typically is formed over the entire antireflective coating layer, it should be understood that the degradation to the lubrication layer is believed to occur primarily in regions in which the deflectable member contacts the charged lubrication layer. Therefore, the present invention does not require the insulator layer to entirely cover the antireflective coating layer. Furthermore, the insulator layer may only be required on one of the two antireflective coatings when two antireflective coatings are used.

Improved Micromirror Display System

Figure 5:
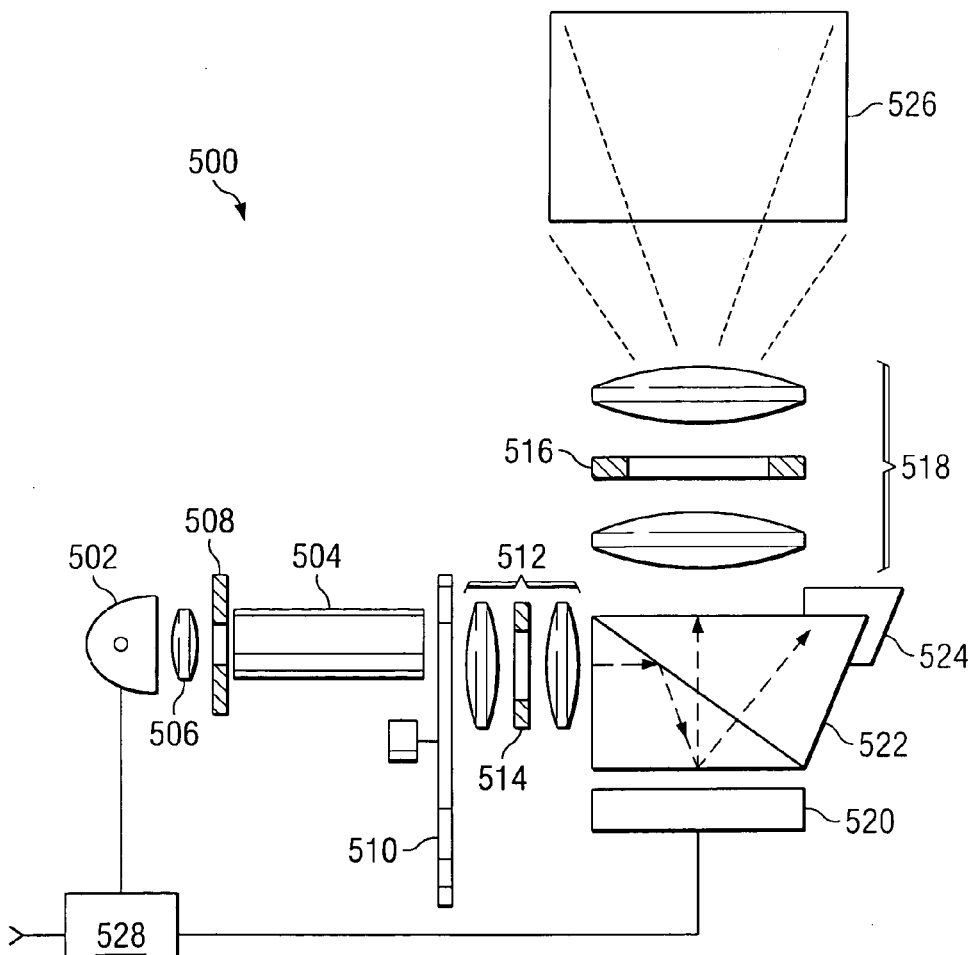
FIG. 5 is a schematic view of a micromirror based projection system utilizing an improved micromirror device according to one embodiment of the present invention.

FIG. 5 is a schematic view of a micromirror-based projection system 500 utilizing the one embodiment of the coating and methods described herein. In FIG. 5, light from light source 502 is focused on the entrance pupil of an integrating rod 504 by lens group 506. The entrance pupil of the integrating rod 504 is surrounded by a reflective aperture stop 508. Light striking the reflective aperture stop 508 is returned to the light source. The integrating rod 504 homogenizes the light passing through it. Light exiting the integrating rod 504 passes through a color wheel 510—which may be a scrolling color wheel or other type of recycling color wheel.

The light passing through the color wheel 510 is focused by lens group 512. Aperture stop 514 typically is located in lens group Lens group 512 focuses the illumination light onto a spatial light modulator 520 through a TIR prism assembly 522. The spatial light modulator 520 includes antireflective coatings (not shown) and insulating layers (not shown) as described above. The off state light and the flat state light may be directed to a light dump 524 which absorbs the light.

On state light exits the TIR prism assembly 522 and enters the projection lens 518. Another aperture stop 516 typically is used in the projection lens 518 to block a portion of the light, preventing it from passing through the lens to the image plane 522. Controller 528 provides image data and control signals to the spatial light modulator 520 to control the modulation of the illumination light in order to form an image on the image plane 526. Similar projection methods are used with color splitting prisms and three modulators in high brightness color projectors.

Thus, although there has been disclosed to this point a particular embodiment for a coating for a micromechanical device and method, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims. In the following claims, only elements denoted by the words "means for" are intended to be interpreted as means plus function claims under 35 U.S.C. § 112, paragraph six.

What is claimed is:

1. A method of forming a coating comprising:
providing a substrate having a metal layer;
applying an antireflective layer to said substrate layer;
applying an insulator layer to said antireflective layer; and
applying a lubrication layer to said insulator layer.

2. The method of claim 1, said applying an insulator comprising:
applying an oxide layer over said antireflective layer.

3. The method of claim 1, said applying an insulator comprising:
applying an oxide layer over said antireflective layer using plasma deposition.

4. The method of claim 1, said providing comprising:
providing a partially fabricated micromechanical device.

5. The method of claim 1, said providing comprising:
providing a partially fabricated micromechanical device having an electrode.

6. The method of claim 1, said providing comprising:
providing a partially fabricated micromechanical device having an aluminum alloy electrode.

7. The method of claim 1, said providing comprising:
providing a partially fabricated micromirror device comprising an aluminum alloy landing electrode supported by a semiconductor substrate.

8. The method of claim 7, said applying an antireflective coating comprising:
applying a titanium nitride coating to said landing electrode.

9. The method of claim 8, said applying an insulator layer comprising:
applying an oxide layer over said titanium nitride coating.

10. The method of claim 8, said applying an insulator layer comprising:
applying an oxide layer over said titanium nitride coating using plasma deposition.

11. The method of claim 8, said applying an insulator layer comprising:
growing a thermal oxide layer over said titanium nitride coating.

12. The method of claim 9, said applying a lubrication layer comprising:
applying a halogenated acid layer to said oxide layer.

13. The method of claim 9, said applying a lubrication layer comprising:
applying a perfluorodecanoic acid layer to said oxide layer.

14. The method of claim 1, said applying an insulator layer comprising:
applying a metal layer over said antireflective layer; and
oxidizing said metal layer.

15. The method of claim 1, said applying an insulator layer comprising:
applying a metal layer no thicker than 200 Å over said antireflective layer; and
oxidizing said metal layer.

16. The method of claim 1, said applying an insulator layer comprising:
applying a metal layer no thicker than 100 Å over said antireflective layer; and
oxidizing said metal layer.

17. The method of claim 1, said applying an insulator layer comprising:
applying an aluminum layer no thicker than 100 Å over said antireflective layer; and
oxidizing said metal layer.

18. The method of claim 1, said applying a lubrication layer comprising:
applying a halogenated acid layer to said insulator layer.

19. The method of claim 1, said applying a lubrication layer comprising:
applying a perfluorodecanoic acid layer to said insulator layer.

20. A micromechanical device comprising:
a substrate;
a reflective member supported on said substrate;
an antireflective coating supported on said reflective member;
an insulator layer supported on said antireflective coating; and
a lubrication layer supported on said insulator layer.

21. The micromechancial device of claim 20, said substrate comprising:
a silicon substrate.

22. The micromechanical device of claim 20, said reflective member comprising:
an aluminum alloy member supported on said substrate.

23. The micromechanical device of claim 20, said reflective member comprising:
an aluminum alloy landing electrode supported on said substrate.

24. The micromechanical device of claim 20, said antireflective coating comprising:
a titanium nitride coating supported on said reflective member.

25. The micromechanical device of claim 20, said insulator layer comprising:
an oxide layer supported on said antireflective coating.

26. The micromechanical device of claim 20, said insulator layer comprising:
an oxide layer plasma deposited on said antireflective coating.

27. The micromechanical device of claim 20, said insulator layer comprising:
an thermal oxide layer grown on said antireflective coating.

28. The micromechanical device of claim 20, said lubrication layer comprising:
a halogenated acid layer supported on said insulator layer.

29. The micromechanical device of claim 20, said lubrication layer comprising:
a perfluorodecanoic acid layer supported on said insulator layer.

30. A system comprising:
a light source for providing a beam of light along a light path; and
a device on said light path, said device comprising:
a substrate;
a reflective layer;
an antireflective coating supported on said reflective layer;
an insulation layer supported on said antireflective coating; and
a lubrication layer on said insulation layer.

31. The system of claim 30, said substrate comprising:
a silicon substrate.

32. The system of claim 30, said reflective member comprising:
an aluminum alloy member supported on said substrate.

33. The system of claim 30, said reflective member comprising:
an aluminum alloy landing electrode supported on said substrate.

34. The system of claim 30, said antireflective coating comprising:
a titanium nitride coating supported on said reflective layer.

35. The system of claim 30, said insulator layer comprising:
an oxide layer supported on said antireflective coating.

36. The system of claim 30, said insulator layer comprising:
an oxide layer plasma deposited on said antireflective coating.

37. The system of claim 30, said insulator layer comprising:
an thermal oxide layer grown on said antireflective coating.

38. The system of claim 30, said lubrication layer comprising:
a halogenated acid layer supported on said insulator layer.

39. The system of claim 30, said lubrication layer comprising:
a perfluorodecanoic acid layer supported on said insulator layer.

* * * * *